(12) United States Patent
Johnson

(10) Patent No.: US 8,253,166 B2
(45) Date of Patent: Aug. 28, 2012

(54) BAND OFFSET IN ALINGAP BASED LIGHT EMITTERS TO IMPROVE TEMPERATURE PERFORMANCE

(75) Inventor: Ralph Herbert Johnson, Murphy, TX (US)

(73) Assignee: Finisar Corporation, Sunnyvale, CA (US)

( * ) Notice: Subject to any disclaimer, the term of this patent is extended or adjusted under 35 U.S.C. 154(b) by 543 days.

(21) Appl. No.: 10/940,697

(22) Filed: Sep. 14, 2004

(65) Prior Publication Data
US 2006/0054902 A1 Mar. 16, 2006

(51) Int. Cl.
*H01L 33/00* (2010.01)

(52) U.S. Cl. ........... 257/190; 257/18; 257/22; 257/184; 257/201

(58) Field of Classification Search ............... 257/9, 14, 257/22, 98, 103, 94, 96, 99, 190, 18, 184, 257/201
See application file for complete search history.

(56) References Cited

U.S. PATENT DOCUMENTS

| | | | | |
|---|---|---|---|---|
| 5,315,128 A | * | 5/1994 | Hunt et al. | 257/16 |
| 5,689,123 A | * | 11/1997 | Major et al. | 257/190 |
| 5,751,014 A | * | 5/1998 | Nakatsu et al. | 257/25 |
| 5,825,796 A | | 10/1998 | Jewell et al. | 372/45 |
| 5,904,549 A | * | 5/1999 | Sato | 438/478 |
| 6,570,191 B2 | * | 5/2003 | Mizuno et al. | 257/98 |
| 6,813,295 B2 | * | 11/2004 | Takeuchi et al. | 372/45.01 |
| 2001/0030319 A1 | * | 10/2001 | Sato et al. | 257/14 |
| 2002/0075920 A1 | * | 6/2002 | Spruytte et al. | 372/45 |
| 2004/0161006 A1 | * | 8/2004 | Chang et al. | 372/45 |
| 2005/0040413 A1 | * | 2/2005 | Takahashi et al. | 257/96 |

* cited by examiner

*Primary Examiner* — Zandra Smith
*Assistant Examiner* — Tsz Chiu
(74) *Attorney, Agent, or Firm* — Maschoff Gilmore & Israelsen

(57) ABSTRACT

Systems and methods for improving the temperature performance of AlInGaP based light emitters. Nitrogen is added to the quantum wells in small quantities. Nitrogen is added in a range of about 0.5 percent to 2 percent. The addition of nitrogen increases the conduction band offset and increases the separation of the indirect conduction band. To keep the emission wavelength in a particular range, the concentration of In in the quantum wells may be decreased or the concentration of Al in the quantum wells may be increased. Because the depth of the quantum wells in the valence band is more than is required although the addition of nitrogen reduces the depth of the quantum wells in the valence band. The net result is an increase in the conduction band offset and an increase in the separation of the indirect conduction band.

16 Claims, 3 Drawing Sheets

BAND OFFSET IN ALINGAP BASED LIGHT EMITTERS TO IMPROVE TEMPERATURE PERFORMANCE

CROSS-REFERENCE TO RELATED APPLICATIONS

Not Applicable.

BACKGROUND OF THE INVENTION

1. The Field of the Invention

The present invention relates to systems and methods for improving band offset in semiconductor light emitters. More particularly, the present invention relates to systems and methods for improving band offset in semiconductor light emitters for improved temperature performance.

2. Background and Relevant Art

Semiconductor light emitters can take a variety of different forms. Light emitting diodes (LEDs), vertical cavity surface emitting lasers (VCSELs), and edge emitting lasers are examples of semiconductor light emitters. Semiconductor light emitters can also emit light at various wavelengths. However, the ability to emit light at shorter wavelengths (in the visible spectrum, for example) faces several challenges, particularly in VCSELs.

One of the system materials currently used to produce VCSELs emitting a wavelength in the visible spectrum is AlInGaP (Aluminum Indium Gallium Phosphide). In fact, AlInGaP materials are often used in lasers that emit light at wavelengths in the red region of the visible spectrum. However, the wavelengths that can be emitted using an AlInGaP system material are typically limited.

Some of the factors that limit the range of wavelengths that can be emitted by an AlInGaP device include the inability to obtain sufficiently high p-type doping levels, low hole mobility, and a small conduction band offset. The small conduction band offset can result in poor carrier confinement, which impacts the quality of the device.

For example, AlInGaP VCSELs that are designed to be red light emitters (emitting a wavelength on the order of 690-630 nm) face challenges that are related to both temperature and conduction band offset. The thermal distribution of energy can excite carriers out of the quantum wells. If the carriers are not in the quantum wells, then the carriers cannot recombine to produce light. This problem is further complicated by the low conduction band offset. In other words, the quantum wells of AlInGaP devices have shallow wells. The shallowness of the wells combined with temperature leads to poor carrier confinement and carrier leakage.

In addition, AlInGaP devices often have a close indirect conduction band in addition to a low conduction band offset. The close indirect conduction band can also lead to carrier leakage from the quantum wells and further requires a phonon to conserve momentum of the photon. Thus, the low conduction band offset, the close indirect conduction band, and higher temperatures result in poor carrier confinement and degrade the high temperature performance of AlInGaP devices.

BRIEF SUMMARY OF THE INVENTION

These and other limitations are overcome by embodiments of the present invention, which relate to systems and methods for changing band offsets in light emitters, including semiconductor lasers such as VCSELs, to improve the temperature performance of the light emitters. Many VCSELs that emit light in the visible spectrum are AlInGaP based devices. As previously indicated, AlInGaP VCSELs suffer from poor offset in the conduction band as well as a close indirect conduction band. These factors degrade the high temperature performance of AlInGaP based devices.

In one embodiment of the invention, nitrogen is added to the quantum well region is small quantities. Typically, nitrogen is added in a range of 0.2 to 2.5 percent, but is often added at a concentration of about 1 percent. The addition of nitrogen to the quantum well region increases the band offset and increases the separation of the indirect conduction band. The addition of nitrogen also impacts the band offset of the valence band. Because the valence band had a discontinuity that was greater than required, the decrease in the discontinuity of the valence band related to the addition of nitrogen does not impact performance of the device.

In another embodiment, the addition of nitrogen may change the bandgap of the device and thus change the emission wavelength of the AlInGaP or InGaP based device. The bandgap can be adjusted by increasing the concentration of aluminum and/or decreasing the concentration of indium. This has the effect of keeping the emission wavelength within an acceptable range. The net effect of adding nitrogen, increasing the concentration of aluminum, and/or decreasing the concentration of indium is to increase the conduction band offset, increase the separation of the indirect conduction band, and/or keep the emission wavelength within acceptable bounds.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The visible spectrum includes wavelengths of approximately 400 nm to 750 nm. At these wavelengths, the system materials used to make light emitting devices such as vertical cavity surface emitting lasers (VCSELs) include AlInGaP based devices, AlGaAs based devices, InGaP based devices, and other system materials known to one of skill in the art. AlInGaP is often selected for these types of light emitting devices including those that emit in the red region of the visible spectrum (690 to 630 nm, for example).

The performance of an AlInGaP based device is often related to the band offsets and carrier confinement. For example, AlInGaP devices tend to have a direct bandgap that is greater than the direct bandgap of AlGaAs devices, but the conduction band offset is insufficient in AlInGaP devices. The effect of the low conduction band offset in AlInGaP devices has an impact on the wavelengths that can be emitted and further has an impact on the performance of the device, particularly at higher temperatures because the low conduction band offset causes poor carrier confinement.

In addition to the poor conduction band offset, the indirect band in AlInGaP is low enough that electrons from a heavily populated direct band can populate the higher density of states in the indirect band, and not take part in radiative recombination.

The present invention relates to systems and methods for improving the band offset in AlInGaP based devices, for example, in the visible spectrum. Although embodiments of the invention are discussed with reference to AlInGaP based devices, one of skill in the art can appreciated that the invention also applies to other system materials including, but not limited to, AlGaAs and InGaP and combinations thereof.

Embodiments of the present invention also improve the temperature performance of AlInGaP based devices. In one embodiment, small quantities of N (Nitrogen) are added to the quantum well layers of AlInGaP based light emitting devices. The nitrogen increases the conduction band offset and also improves the separation of the indirect conduction band. In some embodiments, the wavelength emitted by this type of device can be maintained by changing the composition of the system material. For example, the concentration of aluminum may be increased and/or the concentration of indium may be decreased to keep the emission wavelength within acceptable bounds.

Figure 1:
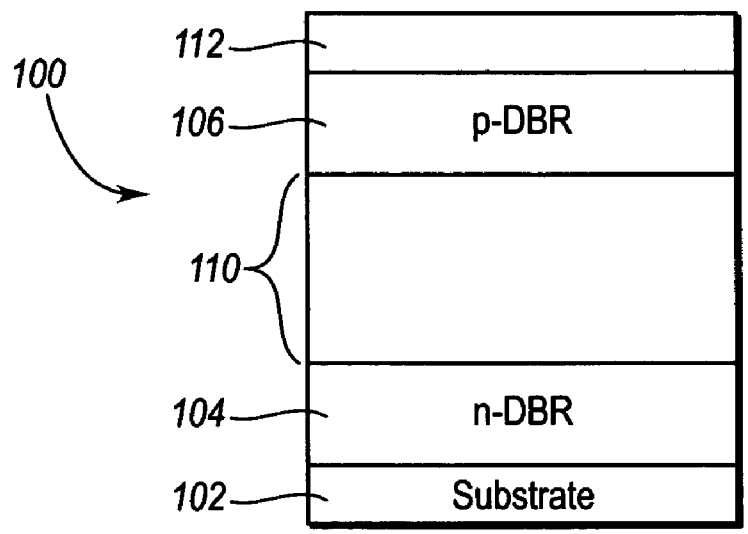
FIG. 1 illustrates one embodiment of a vertical cavity surface emitting laser that emits light in the visible spectrum.

FIG. 1 illustrates generally the epitaxial structure of a vertical cavity surface emitting laser (VCSEL) that emits light in the visible spectrum. The VCSEL 100 includes a substrate 102. In this example, n-type DBR (Distributed Bragg Reflector) layers 104 are formed on the substrate 102. An active region 110 is formed on the n-type DBR layers 104. Next, p-type DBR layers 106 are formed on the active region 110. Then, a cap 112 is typically formed on the p-type DBR layers 106. One of skill in the art can appreciate that other layers may be included in a VCSEL structure.

For example, VCSELs may include insulating regions that are formed, for instance, by implanting ions or by forming an oxide layer. The insulating region is often used to form a conductive annular central opening in the VCSEL. VCSELs may also include tunnel junctions. One of skill in the art can also appreciate that some of the layers may be doped and form either n type or p type materials.

In this example, the DBR layers 104, 106 typically include n pairs of two materials. The two materials in each pair have different refractive indices. The change in refractive index from one material to the other enables DBR layers to have high reflectivity. Each layer in the DBR layers 104, 106 is approximately a quarter wavelength thick. Each DBR layer 104, 106 can include, by way of example and not limitation, from 30 to 50 layer pairs. The DBR layers 104, 106 provide the reflectivity that is needed for the VCSEL 100 to lase.

In this example, the substrate 102 and the cap 112 may both be formed from GaAs. Each pair of layers in the n-DBR layer 104 and the p-DBR layer 106 may include a layer of AlGaAs and a layer of AlAs.

Figure 2:
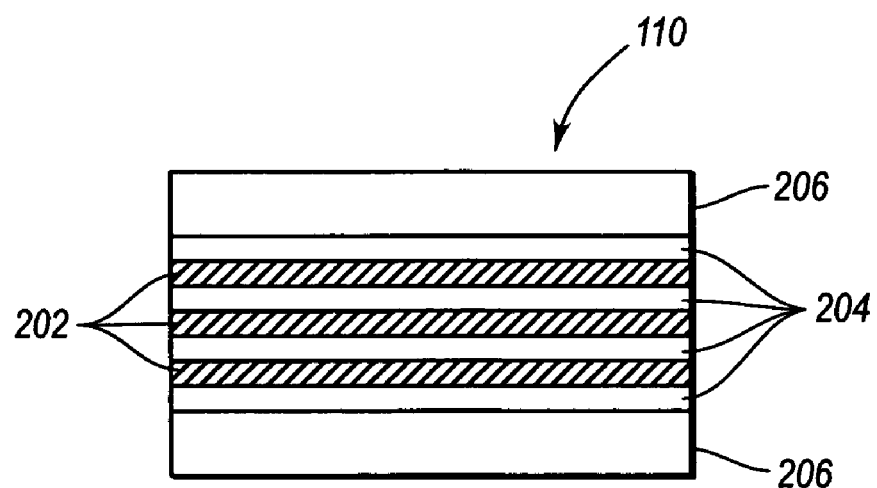
FIG. 2 illustrates one embodiment of an active region for the vertical cavity surface emitting laser shown in FIG. 1.

The active region 110, with reference to both FIG. 1 and FIG. 2, may include a quantum well structure. The active region 110 illustrates quantum wells 202 that are separated by barrier layers 204. The quantum wells 202 and the barrier layers 204 are bounded on either side by spacer layers 206.

The quantum wells 202 have a lower bandgap and is the location where carrier recombination preferably occurs for light emission. As previously stated, however, carrier confinement is problematic because of the low conduction band offset. In addition, conventional devices have a close indirect conduction band that results in carrier leakage. The indirect conduction bandgap is typically inefficient for light emitting purposes. As a result, a close indirect conduction band is typically undesirable in light emitting devices.

In the example of FIG. 2, the quantum wells 202 include InGaP. The barrier layers 204 may include AlInGaP. In one embodiment of the invention, N is added to the quantum wells 202 and/or the barrier layers in various quantities. For example, N can be added in a range of 0.2 to 2.5 percent. In one embodiment, N is added to the quantum wells 202 at a concentration of 1 percent. The addition of N has an impact on both the conduction band offset as well as the valence band offset or valence band discontinuity.

Figure 3A:
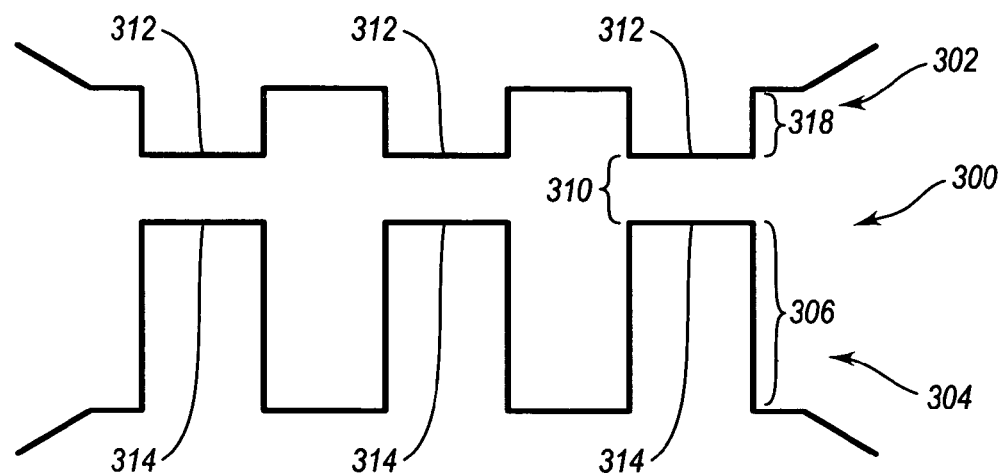
FIG. 3A illustrates an example of the conduction band and the valence band of a light emitting device.

The impact of nitrogen in the active region 110 or in the quantum wells 202 is further illustrated by FIGS. 3A, 3B, 4A, and 4B, which illustrate relationships between conduction bands and valence bands. FIG. 3A, for example, illustrates the conduction band 302 and the valence band 304 for the active region 300 before N is added to the quantum wells. The energy levels 312 correspond to the conduction band of the quantum wells and the energy levels 314 correspond to energy levels of the valence band of the quantum wells. The depth 306 of the wells in the valence band 304 are relatively deep in this example. The depth 308 of the conduction band is shallow and suffers from poor carrier confinement as previously described. The bandgap 310 represents the energy difference between the valence band 304 and the conduction band 302. The bandgap 310 is also related to the emission wavelength.

Figure 3B:
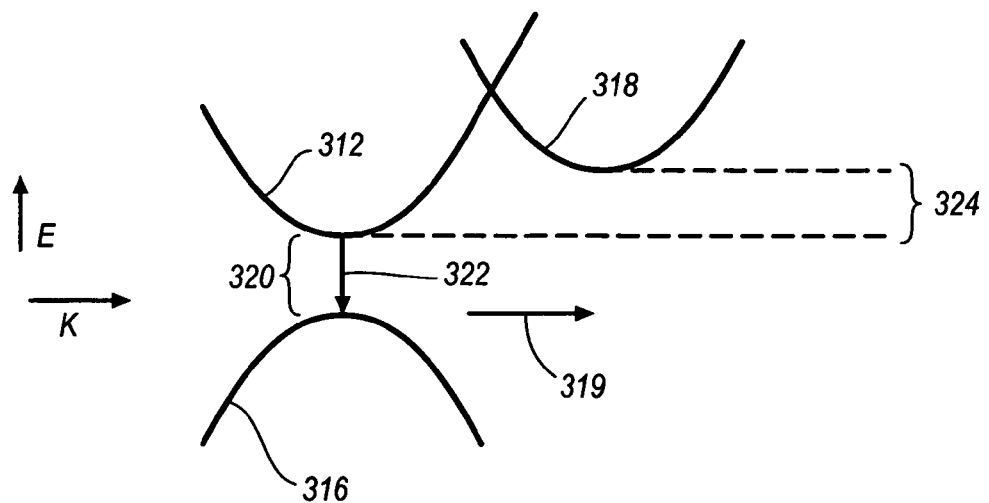
FIG. 3B illustrates an energy versus momentum diagram with radiative recombination between the direct conduction band and the valence band.

FIG. 3B illustrates the energy (E) versus momentum (K) relationship between the valence band 316, the direct conduction band 317 and the indirect conduction band 318. The line 322 indicates the recombination of an electron and a hole and the arrow 319 represents an emitted photon. In this example, the bandgap 320 is relatively close to the bandgap 310. The separation 324 between the direct conduction band 317 and the indirect conduction band 324, however, is low. As a result, carriers may be lost from the direct conduction band 317 to the indirect conduction band 318 as previously described. In other words, the high density of states and the small separation 324 causes electrons to parasitically populate the indirect conduction band 324.

Figure 4A:
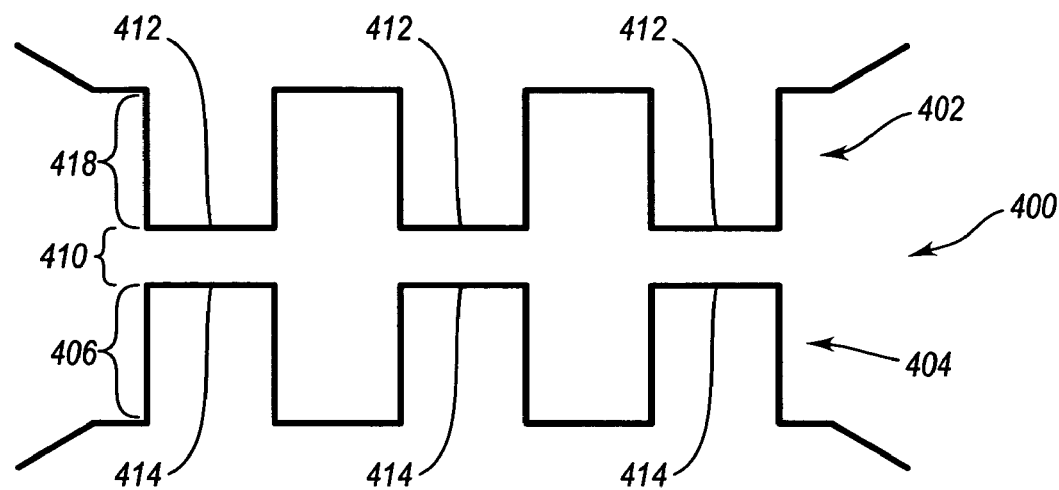
FIG. 4A illustrates another example of the conduction band and the valence band of a light emitting device.

FIG. 4A illustrates a bandgap diagram for a light emitting device (AlInGaP or InGaP based device) with N added in concentrations as described above. Adding N to the quantum wells and/or to the barrier layers increases the depth 408 of the quantum wells in the conduction band 402 compared to the depth 308 of the quantum wells in the conduction band 302. In other words, the conduction band offset is increased by the addition of N, thereby reducing carrier leakage at higher temperatures. In other words, a deeper quantum well in the conduction band improves carrier confinement at higher temperatures and ensures that carrier recombination can occur in the quantum wells.

In one embodiment, however, the addition of N also has the effect of decreasing the depth 406 of the quantum wells in the valence band 404 compared to the depth 306 of the quantum wells in the valence band 304. However, the valence band 404 had more of a discontinuity or band offset that was needed. Thus, the depth 406 in the valence band 404 is not too shallow and the depth 408 of the conduction band 402 controls. In one embodiment, the depth 408 of the conduction band 402 controls the effectiveness of carrier recombination at higher temperatures.

The addition of N to the quantum wells may also have an impact on the bandgap 410. In this example, the bandgap 410 may no longer be substantially equal to the bandgap 310. Thus, the emission wavelength associated with the active region 400 is different that the emission wavelength associated with the active region 300.

Embodiments of the invention, in addition to increasing the conduction band offset, also keep the emission wavelength (and thus the bandgap) within acceptable bounds. By way of example and not limitation, embodiments of the invention may increase the concentration of aluminum in the quantum wells and/or decrease the concentration of indium in the quantum wells to keep the emission wavelength within acceptable bounds.

Figure 4B:
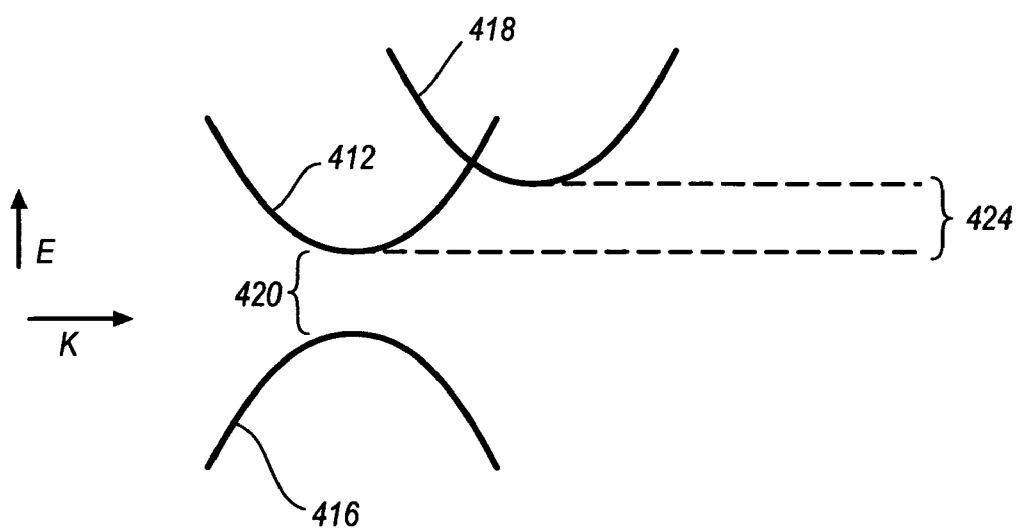
FIG. 4B illustrates an energy versus momentum diagram with radiative recombination between the direct conduction band and the valence band but with a larger offset between the direct conduction band and the indirect band compared to the offset between the direct conduction band and the indirect band illustrated in FIG. 3B.

FIG. 4B illustrates an effect of adding N to the quantum wells on the indirect conduction band. The indirect conduction band 418 is still present, but the separation 424 in energy between the direct conduction band 417 and the indirect conduction band 418 has increased (in comparison to the separation 324 shown in FIG. 3B), thereby decreasing the parasitic population in the indirect conduction band 418. In other words, the separation of the indirect conduction band 418 from the direct conduction band increases, which leads a higher portion of the electrons residing in the direct conduction band 417 where optical emission is the dominant recombination mechanism.

The net effect of adding N (in a range of 0.5 to 2 percent as previously stated), increasing the concentration of Al, and/or decreasing the concentration of In, is an increase in the conduction band offset and increased separation of the indirect band from the direct band while keeping the emission wavelength within acceptable bounds. One of skill in the art can appreciate that embodiments of the invention are not limited to the preferred range of 0.5 to 2 percent N, but extend to concentrations outside of this range.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A semiconductor light emitter comprising:
   n-type distributed Bragg reflector (DBR) layers;
   p-type DBR layers;
   an active region arranged between the n-type DBR layers and the p-type DBR layers, the active region being configured to emit light in the visible spectrum; and
   a plurality of quantum wells formed in the active region and separated by barrier layers, wherein each quantum well comprises AlInGaPN, wherein the concentration of nitrogen causes an increased conduction band offset of the active region compared to the active region without the concentration of nitrogen and affects an emission wavelength by changing a bandgap of the light emitter, wherein a concentration of In is reduced or concentration of Al is increased to maintain the emission wavelength in a particular range.

2. A semiconductor light emitter as defined in claim 1, wherein the concentration of nitrogen is in a range from about 0.2 percent to about 2.5 percent.

3. A semiconductor light emitter as defined in claim 1, wherein the concentration of nitrogen is in a range of 0.5 percent to 2 percent.

4. A semiconductor light emitter as defined in claim 1, wherein the concentration of In is reduced to maintain the emission wavelength in a particular range.

5. A semiconductor light emitter as defined in claim 1, wherein the concentration of Al is increased to maintain the emission wavelength in a particular range.

6. A semiconductor light emitter as defined in claim 1, wherein the concentration of nitrogen increases the indirect band gap of the active region compared to the indirect bandgap of the active region where the nitrogen is not included.

7. A semiconductor light emitter comprising:
   an n-type layer;
   a p-type layer;
   an active region arranged between the n-type layer and the p-type layer, the active having a plurality of quantum wells and a plurality of quantum well barriers that are configured to emit light in the visible spectrum;
   each quantum well including AlInGaPN; and
   a concentration of nitrogen included in the active region, wherein the concentration of nitrogen causes an increased conduction band offset of the active region compared to the active region without the concentration of nitrogen and affects an emission wavelength by changing a bandgap of the light emitter, wherein a concentration of In in the quantum wells is reduced or concentration of Al in the quantum wells is increased to maintain the emission wavelength in a particular range.

8. A semiconductor light emitter as defined in claim 7, wherein the concentration of nitrogen is in a range from about 0.2 percent to about 2.5 percent.

9. A semiconductor light emitter as defined in claim 7, wherein the concentration of nitrogen is in a range of 0.5 percent to 2 percent.

10. A semiconductor light emitter as defined in claim 7, wherein the concentration of In is reduced to maintain the emission wavelength in a particular range.

11. A semiconductor light emitter as defined in claim 7, wherein the concentration of Al is increased to maintain the emission wavelength in a particular range.

12. A semiconductor light emitter as defined in claim 7, wherein the concentration of nitrogen increases the indirect band gap of the active region compared to the indirect bandgap of the active region where the nitrogen is not included.

13. A semiconductor light emitter as defined in claim 7, wherein the n-type layer further comprises Distributed Bragg Reflector layers and the p-type layer further comprises Distributed Bragg Reflector layers.

14. A semiconductor light emitter comprising:
an n-type layer;
a p-type layer;
an active region positioned between the n-type layer and the p-type layer, the active region having a plurality of quantum wells and a plurality of quantum well barriers, at least a portion of the active region comprising AlInGaPN wherein the nitrogen concentration is in a range from about 0.2 percent to about 2.5 percent and the active region is configured to emit light in the visible spectrum, wherein the concentration of nitrogen causes an increased conduction band offset of the active region compared to the active region without the concentration of nitrogen and affects an emission wavelength by changing a bandgap of the light emitter, wherein a concentration of In is reduced or concentration of Al is increased to maintain the emission wavelength in a particular range.

15. A semiconductor light emitter as defined in claim 14, wherein the active concentration of nitrogen is in a range from 0.5 percent to 2.0.

16. A semiconductor light emitter as defined in claim 14, further comprising a first DBR and a second DBR.

* * * * *